United States Patent [19]

Morley, II et al.

[11] Patent Number: 5,014,549

[45] Date of Patent: May 14, 1991

[54] TEST APPARATUS FOR AIR INTAKE MANIFOLD HEATER SYSTEM

[75] Inventors: Lloyd F. Morley, II, Columbus; Russell L. Harrod, Scottsburg, both of Ind.

[73] Assignee: Cummins Engine Company, Inc., Columbus, Ind.

[21] Appl. No.: 477,495

[22] Filed: Feb. 9, 1990

[51] Int. Cl.$^5$ .......................................... G01M 15/00
[52] U.S. Cl. ................................................ 73/118.1
[58] Field of Search ................ 73/118.1, 865.8, 865.6; 340/640, 655; 219/206

[56] References Cited

U.S. PATENT DOCUMENTS

| | | | |
|---|---|---|---|
| 3,744,046 | 7/1973 | Tamasi | 340/640 |
| 4,583,086 | 4/1986 | Andrews et al. | 340/640 |
| 4,739,184 | 4/1988 | Onesti | 73/865.9 |
| 4,825,199 | 4/1989 | Antilozi | 340/640 |

Primary Examiner—Robert Raevis
Attorney, Agent, or Firm—Sixbey, Friedman, Leedom & Ferguson

[57] ABSTRACT

The test apparatus for an electric air intake manifold heater system according to the present invention includes a mechanism for simulating a temperature signal of the heater system thermistor and inputting this signal into the thermistor input of the electronic control module of the heater system. The temperature signal simulating mechanism is selectively operable to simulate a predetermined portion of the range of operating temperatures for the system. The test apparatus also includes a volmeter which measures the complete system voltage. The voltmeter can alternately be connected to the electrical supply of a fuel pump cold start system valve, where provided, to observe the actuation voltage and verify the actuation cycle thereof. Color coded lights indicate proper actuation of the heater elements. The method according to the present invention includes connecting positive and negative tester leads to the respective terminals of the heater system power supply and measuring the heater system voltage during actuation cycles. The tester leads may alternately be connected to the cold start system valve electrical supply connection to measure the actuation voltage thereof. Additional tester leads are connected to the relays of the heater system to detect heater element actuation. A signal operates color coded lights to permit visual verification of heater element actuation.

20 Claims, 3 Drawing Sheets

TEST APPARATUS FOR AIR INTAKE MANIFOLD HEATER SYSTEM

TECHNICAL FIELD

The present invention relates to a test apparatus for an air intake manifold heater system and cold start system used on compression ignition internal combustion engines.

BACKGROUND OF THE INVENTION

One of the disadvantages of compression ignition internal combustion engines, especially of the low compression ratio type described in U.S. Pat. No. 3,526,214 is the occasional production of "white smoke" which is unburned fuel vapor suspended in the exhaust gas. White smoke occurs particularly during cold starting, idling, and low load operation when the temperature distribution of the intake air supplied to the cylinder is uneven or insufficient to completely combust the fuel in the cylinder. Thus, white smoke is materially different from black smoke which is formed of carbon particles produced when the compression temperature is adequate to support combustion but the local oxygen supply is insufficient to oxidize all of the carbon in the fuel.

In order to reduce and eliminate the production of white smoke, numerous systems have been employed. One method involves heating the intake air of a compression ignition internal combustion engine to effect complete combustion. One system used for heating intake air includes a computer-controlled electric manifold heater system. In this system, heater elements are connected to respective heater relays which, in turn, are preferably connected to a thermistor through an electronic control module. This system is powered by the vehicle battery. The heater elements operate similarly to induction heating coils, and heat the air in the intake manifold selectively under certain engine temperature conditions to improve combustion. For example, U.S. Pat. No. 4,512,322 to Barcy discloses part of such a system: an electric air heater using heating coils disposed in the path of the intake air and powered by an electric power source.

Another device for controlling white smoke emission is a KSB (fuel pump cold start system) valve as manufactured by the Robert Bosch Co. for use on their fuel pumps and described in the 1989 Dodge Ram/Cummins Turbodiesel 5.9 Liter Student Reference Book. Like the manifold heater system described above, this valve is controlled by a module responding to a thermistor that senses intake manifold temperature. When the thermistor senses an intake manifold temperature of less than 15 degrees C, the control module keeps the KSB valve closed. The closed valve keeps fuel from returning to the low pressure side of the fuel supply pump, thus increasing pump housing pressure and forcing full advance of the fuel pump cam roller ring that controls fuel injection timing.

The electric manifold heater system and the KSB valve system can be used together advantageously since both systems can be controlled by the same thermistor and electronic control module. Significantly, both the electric manifold heater system and the Bosch KSB valve require testing after the system is installed in the vehicle. When white smoke output has been observed, testing is necessary as part of a troubleshooting operation to diagnose the cause of the apparent system failure. The systems also require periodic testing as part of a general maintenance or emissions inspection program.

In accomplishing this testing, it is not sufficient to merely turn on the engine and observe operation of the heater and KSB systems. The heater system is designed to operate in different modes depending on engine temperature; yet, the engine will likely not operate over the entire operating temperature range during the observation, and the operating temperature range cannot be controlled by the individual testing the heater system. Thus, the response of the system to the full range of operating conditions and engine temperatures encountered in the field cannot be determined by observing system operation in the shop.

Therefore, there is a need for a testing system which tests the operation of the components of an electric intake manifold heater system and which can simulate all of the operating temperature ranges sensed by the thermistor. Although individual systems exist for bench-testing the various components and circuitry of an electric manifold heating system, no testing system for post-installation and assembly testing has been developed.

SUMMARY OF THE INVENTION

It is an object of the present invention to provide a test apparatus which tests the operation of an air intake manifold heater system as well as the fuel pump white smoke control.

It is another object of the present invention to provide a test apparatus which simulates the operational engine temperature ranges encountered by the air intake manifold heater system to provide an accurate indication of the operation of the heater system.

It is a further object of the present invention to provide a test apparatus according to the above objects which verifies minimum battery voltage during operation of the heater system and which measures the heater system voltage during actuation cycles.

It is still another object of the present invention to provide a test apparatus according to the above objects which uses individual indicators to verify actuation of intake manifold heater elements.

Yet another object of the present invention is to provide a test apparatus according to the above objects which measures the supply voltage to the fuel pump cold start system valve to verify the cold start system valve actuation cycle.

A further object of the present invention is to provide a method for testing the operation of an air intake manifold system which simulates the operational temperature ranges of the air intake manifold heater system.

It is yet another object of the present invention to provide a method according to the above object which verifies minimum battery voltage and measures the system voltage during actuation cycles.

Still a further object of the present invention is to provide a method according to the above objects which verifies the actuation of the heater element.

These and other objects are achieved by the test apparatus according to the present invention. The test apparatus includes a mechanism for simulating a temperature signal of the heater system thermistor and supplying this signal to the thermistor input of the electronic control module of the heater system. In a preferred embodiment, the temperature signal is simulated by a rotary switch having a plurality of positions, with each position selecting a particular resistance value to be connected across the thermistor input. The resistance values are chosen to simulate the resistance of the thermistor at particular operating temperatures of interest. This temperature signal simulating mechanism is selectively operable to simulate a predetermined portion of the range of operating temperatures for the system. The test apparatus also includes a voltmeter which can measure the complete system voltage to detect low or variable conditions which could affect proper operation of the heater system heating and timing cycles. In addition, the test apparatus is connected to the heating means used by the system and indicators are provided to signal the operator when the heating means have been actuated.

In an alternate mode of operation, when the vehicle is equipped with a Bosch cold start (KSB) or equivalent system the voltmeter is connected to the controlling electrical supply for the fuel pump cold start system (KSB) valve to observe the actuation voltage and verify the KSB valve actuation cycle by measuring the change in supply voltage to the cold start system (KSB) valve as sensed engine operating temperature is varied using the rotary switch.

The method according to the present invention includes the first step of connecting positive and negative tester leads to the respective terminals of the heater system power supply. Leads from the rotary switch mechanism are connected to the thermistor input, and additional tester leads are connected to the controlling relays of the heater system to detect heater element actuation. The rotary switch mechanism is set to simulate a selected operating temperature. Then, the operator actuates the engine and observes system voltage and heater element actuation, comparing the observed heater system response with the response expected for the temperature being simulated. The operator may repeat this test for each temperature simulated by the rotary switch mechanism.

In the alternate method of operation, the positive and negative tester leads are connected to the cold start system (KSB) electrical supply connection to measure the actuation voltage of the fuel pump cold start system (KSB) valve which serves as a further white smoke control. The leads from the rotary switch mechanism are again connected to the thermistor input of the electronic control module, and the changes in actuation voltage of the KSB valve are observed as the rotary switch position is varied to simulate various engine operating temperatures.

Various additional advantages and features of novelty which characterize the invention are further pointed out in the claims that follow. However, for a better understanding of the invention and its advantages, reference should be made to the accompanying drawings and descriptive matter which illustrate and describe preferred embodiments of the invention.

DETAILED DESCRIPTION OF PREFERRED EMBODIMENTS

The test apparatus of the present invention is used to test the operation of an electric air intake manifold heater system. The intake manifold heater system is not directly connected to the fuel system of an engine but rather is connected with the air flow system which causes air to mix with the fuel. In the air flow system, intake air is drawn through an air cleaner into the compressor side of a turbocharger if one is used. The air then flows through an air conduit having an air crossover connection and into the intake manifold from which air enters into the engine combustion chambers through input ports. Before the air enters into the intake manifold, it passes about the metal grid of at least one heater element of the heater system. The heater element is disposed within the air conduit.

Figure 1:
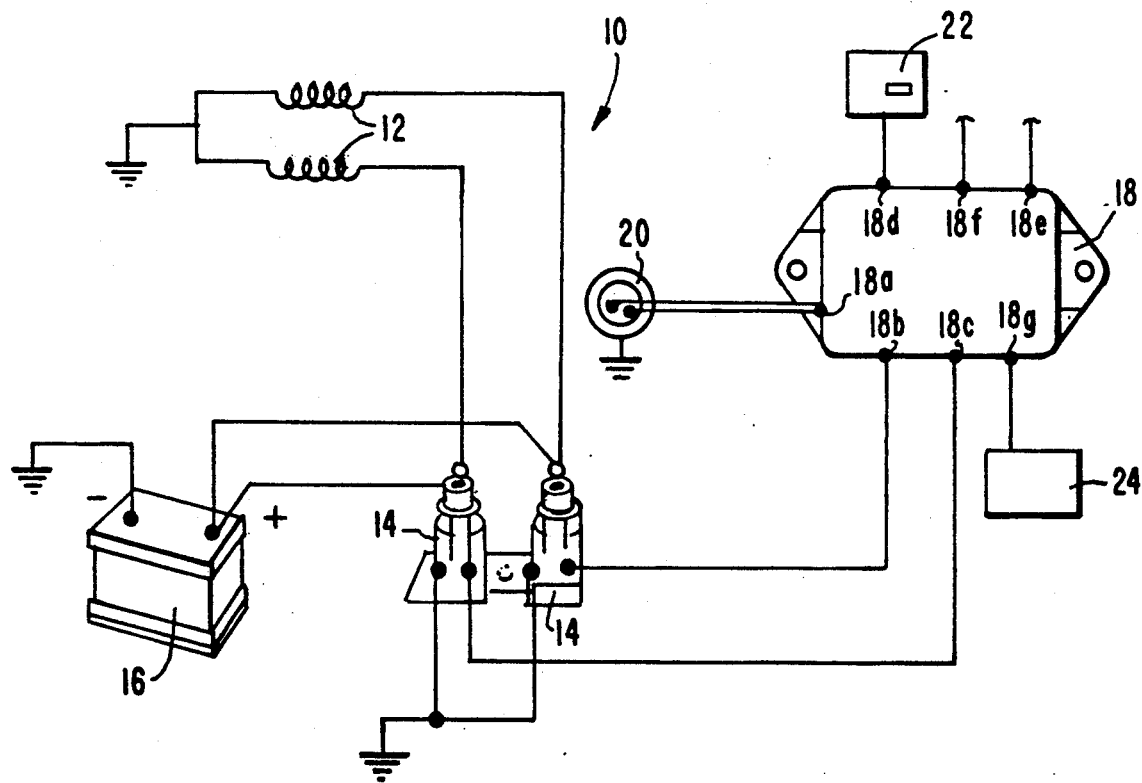
FIG. 1 is a schematic diagram of an air intake manifold heater system.

The electric air intake manifold heater system is shown schematically in FIG. 1. The system 10 includes two intake heater elements 12 which, as discussed above, are disposed within the air conduit adjacent the air intake manifold. The heater elements 12 are preferably electrical resistance type heater elements and are connected to switching devices such as relays 14. Power for the heater elements 12 is supplied through the relays 14 from a power supply such as the vehicle battery 16. A control device such as an air heater controller or an electronic control module 18 sends signals to the relays 14 via control terminals 18b and 18c to operate the heater elements 12. The electronic control module determines whether or not the intake air is heated and, by selectively actuating either one or both heating elements, determines the degree of heating. The electronic control module 18, in turn, receives a temperature signal, which is indicative of the intake air temperature, at sensor terminals 18a, the signal being generated by a thermistor 20.

The electronic control module 18 receives and processes a number of input parameters and conditions, and generates numerous signal outputs to operate the various components of the heater system as well as other systems. As is described more fully below, the electronic control module 18 is connected to the thermistor 20 at sensor terminal 18a. The thermistor 20 has a resistance which varies with ambient temperature at the thermistor 20. Electronic control module 18 receives a temperature signal from the thermistor 20 which varies with temperature. Output signals to the heater relays 14 are sent through lines from control terminals 18b and 18c. Output terminal 18d provides a signal to a "Wait to Start" light 22 and ignition activation terminal 18e receives voltage when the ignition switch is in the "ON" position. A signal from the starter relay (not shown) is input to the electronic control module 18 at starter activation terminal 18f. Additional connections (not shown) lead to a "water in fuel" light and chassis ground.

The electronic control module 18 also controls operation of the fuel pump cold start system (KSB) valve 24 through an output signal transmitted through KSB control terminal 18g.

As explained previously, the air intake manifold heater system 10 operates as part of the engine air intake system. The thermistor 20 is disposed in the engine air intake manifold and monitors the air temperature of the incoming air. The thermistor 20 provides a variable resistance depending on ambient air temperature, and this resistance forms an input signal to electronic control module 18 at sensor terminals 18a. The electronic control module 18 then interprets the thermistor input signal to control the "Wait to Start" light 22 (while the ignition switch is in the "ON" position) and the activation cycles of the heater relays 14. The heater element 12 will operate in a preheat mode when the ignition switch is in the "ON" position, and in a postheat mode after the crank cycle to start the engine is sensed. Thus, the preheat mode occurs when the engine is first turned on and the ignition switch is "ON" but the engine is not running. The "Wait to Start" light 22 is activated until the system 10 completes the preheat mode air heating operation is completed, and the intake air is at a sufficiently high temperature to support complete combustion. After the "Wait to Start" light 22 turns off, the ignition switch may be moved to the "START" position to activate the starter crank cycle and begin running the engine, and further air heating operates in the postheat mode.

A cold start system (KSB) valve control system 24 is also controlled by a signal from the electronic control module 18. Like the intake manifold heater system, the KSB valve control system 24 also controls white smoke during engine operation. The KSB valve (not shown) is mounted on the fuel pump and regulates the start-up operation of the fuel pump. This regulation is secondary to the cam plate advancement on the fuel pump.

The KSB valve alters the normal operation of the fuel pump advance mechanism by acting, as soon as a cold engine is started, to rapidly raise the control or pump housing pressure sufficiently to cause the cam roller ring of the fuel pump to go full advance. Preferably, KSB valve operation is controlled depending on air intake manifold temperature, and its operation, therefore, can be controlled by the electronic control module 18 in response to the temperature signal input thereto by the thermistor 20. Electronic control module 18 selectively produces an output signal at KSB control terminal 18g, which causes KSB valve control system 24 to activate or deactivate the KSB valve. More specifically, when the thermistor senses and communicates to the electronic control module 18 an air temperature greater than or equal to 15° C., a circuit to the cold start system (KSB) valve is completed. When the circuit is completed, power is supplied to the cold start system (KSB) valve heater element from the battery 16. The heater element, along with wax pellets and a plunger assembly, are also part of the KSB valve control system. The KSB heater element heats and expands the wax pellets formed in the expansion chamber, forcing the plunger to move against and open the KSB valve. This opens the fuel drain path to the low pressure side of a vane supply pump of the fuel pump.

Figure 2:
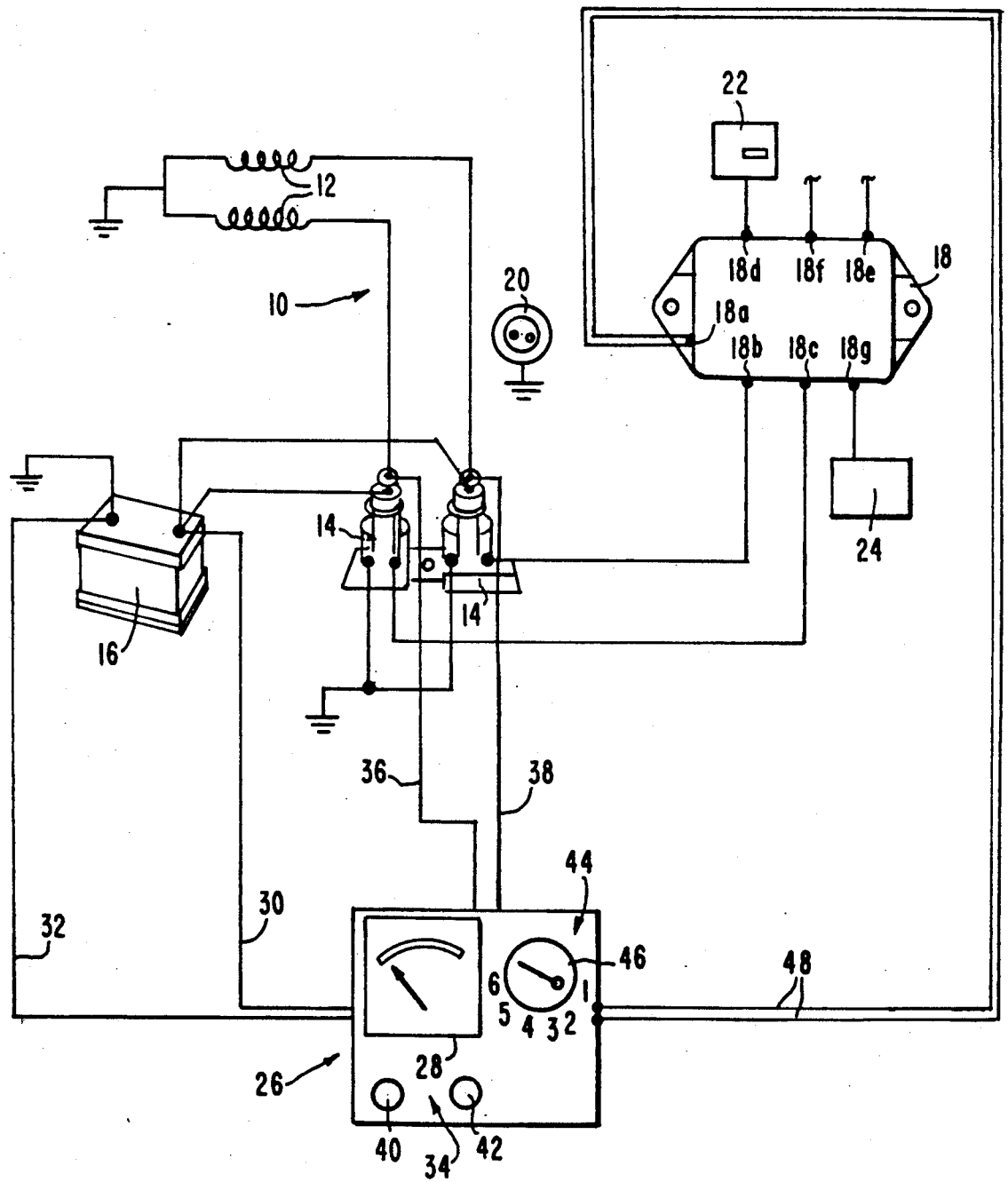
FIG. 2 is a schematic diagram of a test apparatus according to the present invention connected to the air intake manifold heater system of FIG. 1.

Turning now to FIG. 2, the test apparatus 26 for the heater system 10 is shown, connected for use in a first operational mode. Test apparatus 26 comprises a voltmeter 28 having positive lead 30 and negative lead 32, a temperature simulation device 44 having a selector 46 and lead 48, and heater element actuation indication device having indication lights 40 and 42 and leads 36 and 38, all installed in a common case. These components combine to form the test apparatus 26 which tests actuation of heater system 10 and KSB valve control 24 after assembly and installation on the engine as part of a maintenance and trouble shooting program.

The voltmeter 28 is used to measure the complete system voltage and to detect low or variable voltage conditions which could affect the proper operation of the heater system's heating and timing cycles. The voltmeter 28 can be any standard, off-the-shelf DC voltage meter, preferably measuring at least 12 volts DC. One suitable voltmeter has a 0–15 volt scale and is sold by the Tandy Corporation (Radio Shack Catalog number 270-1754). Two modes of operation are possible for the tester. In the first mode of operation (shown in FIG. 2), the voltmeter 28 is connected to the positive and negative terminals of the battery 16 via voltmeter leads 30 and 32 to measure battery output voltage. A minimum voltage is required for proper actuation of the electronic control module 18, and this may be measured by voltmeter 28. Also, when the heater elements 12 are operating the voltage measured by the voltmeter 28 will be reduced slightly as a result of the large current draw of the resistance heating elements 12; movement of the meter's indicating needle can be observed to verify that the heater elements 12 are drawing current.

In a second mode of operation, the voltmeter positive test lead 30 is connected to the KSB control terminal 18g, while the negative test lead 32 is connected to ground. The meter 28 then measures the actuation voltage to the cold start system (KSB) valve to verify the KSB valve actuation cycle.

Figure 3:
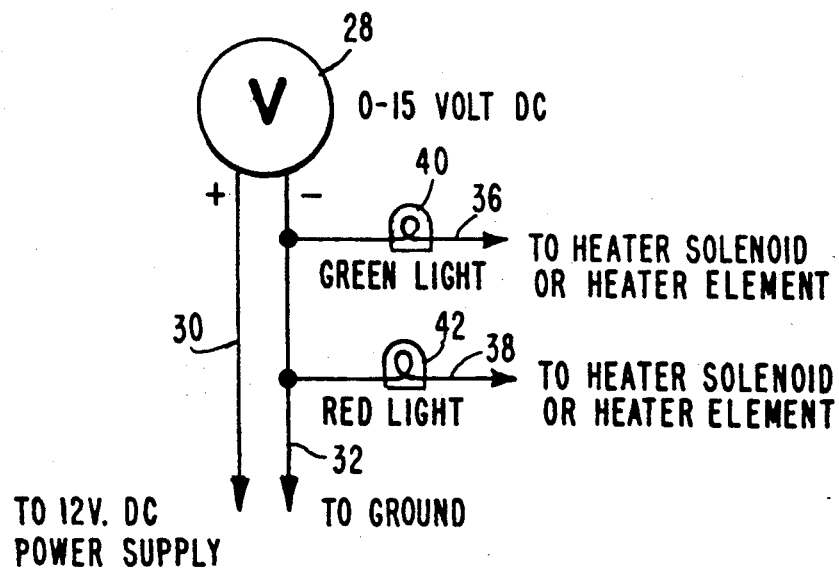
FIG. 3 is a schematic diagram of the heater element actuation indication device of the test apparatus of FIG. 2.

The circuit of heater element actuation indication device 34 is shown in FIG. 3. Heater element actuation indication device 34 has leads 36, 38 and color coded indication lights 40 and 42. The indication lights 40 and 42 may preferably be 12 V DC incandescent lamps or light-emitting diodes. Each of the lights 40 and 42 has two terminals, one of which is connected by a lead 36 or 38 respectively to the positive output of a respective relay 14 of the heater system 10. The other terminal of each light 40 and 42 is connected to the negative terminal of battery 16. The negative terminal connection is preferably accomplished by connecting the terminals of lights 40 and 42 to the negative voltage lead 32 of voltmeter 28. When a relay 14 is actuated and providing power to a heater element 12, positive voltage is provided at the output of the relay 14, and a voltage differential is created across the light(s) 40 and/or 42. The indication light(s) 40 and/or 42 will glow, showing that the corresponding relay 14 has been actuated. The heater element actuation indication device 34 supplements the operation of the voltmeter 28 by indicating the continuity of power through the heater elements 12. In the embodiment shown, two lights 40 and 42 are provided, but it will be recognized that another number of lights could be used if the system 10 has a different number of heating elements 12 or relays 14. In addition, while the indicators have been described as lights, other indicating means, visual or audio signals could be used without departing from the spirit of the present invention.

Figure 4:
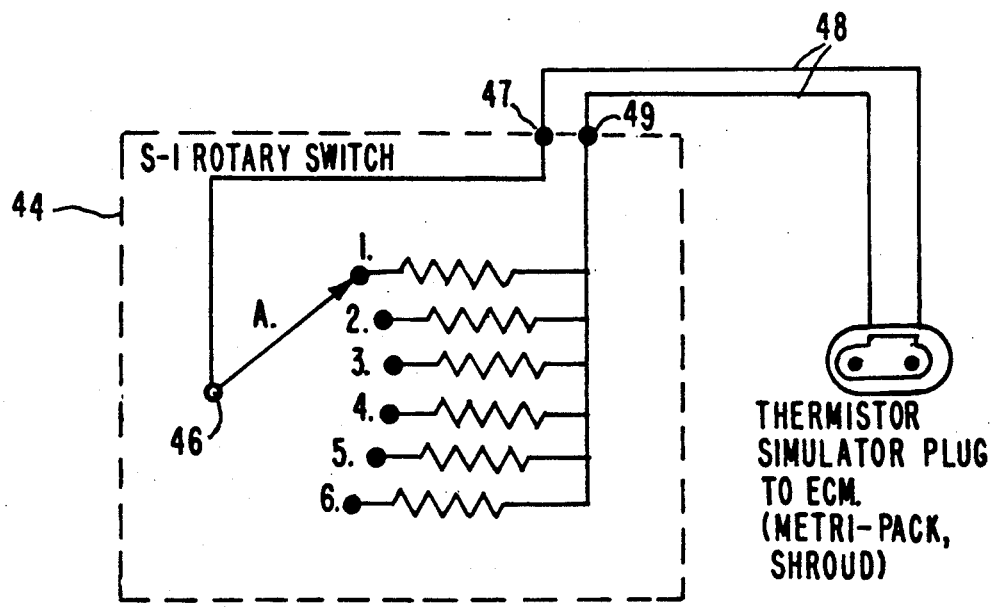
FIG. 4 is a schematic diagram of the temperature simulation device of the test apparatus of FIG. 2.

As shown in FIG. 4, the final primary system of the test apparatus 26 is the temperature simulation device 44, which includes a manually adjustable selector 46. The selector 46 is a conventional switch which is preferably movable among six different positions, so as to connect a first, common terminal 47 of the selector 46 selectively to one terminal of any of six differentially valued resistors, each of said resistors having its other terminal connected to a second terminal 49 of selector 46. The terminals 47 and 49 of selector 46 are connected by leads 48 to the temperature sensor terminal 18a of the electronic control module 18 of the heater system 10

(after the thermistor 20 is disconnected from the same sensor terminal 18a).

Each selectable resistance value corresponds to a predetermined portion of the range of temperature through which the heater system 10 normally operates and is to be tested. The temperature simulation device 44 is required to simulate the various operating temperatures because, otherwise, the thermistor is exposed to only the ambient temperature during testing, and this temperature may be out of the operational temperature range for the heater and KSB valve systems. When the temperature simulation device 44 is activated, it provides a resistive signal to the electronic control module 18 corresponding to the pre-selected operating mode to facilitate observation of the functions of heater system 10 and KSB valve 22 under those simulated conditions. By sequentially selecting all six of the temperature ranges on the selector 46, the heater system 10 can be tested throughout its entire operating temperature range. The various temperature ranges are simulated by different resistance values, supplied by standard, off-the-shelf resistors.

As indicated above, the test apparatus 26 according to the present invention provides a means for and a method for testing the operation of the manifold heater system 10 including testing the system throughout the various temperature ranges encountered during its operation. Heretofore, there has been no system for testing the heater system at temperatures other than the current ambient temperature at the time and location of the test. Additionally, the present invention provides a single casing for housing the voltmeter 28, the heater element actuation indication device 34 and the temperature simulation device 44. All three testing systems may be incorporated into a single unit which is easily manufacturable, transportable, and whose elements work together to test vehicle white smoke control systems.

As FIG. 4 and the following Chart I indicate, the temperature simulation device 44 of the test apparatus 26 has six test positions, each corresponding to a different temperature range within the total range of temperatures normally encountered by the heater system.

Chart I
S-1 Rotary Switch Positions

| Switch Position | Resistance Applied to ECM |
| --- | --- |
| A-1 | 12 K |
| A-2 | 24 K |
| A-3 | 40 K |
| A-4 | 75 K |
| A-5 | 120 K |
| A-6 | 200 K |

In Chart II below, the operational sequence for heater systems using a 15° C. (59° F.) thermistor is shown. For heater systems using different thermistors, similar but different operating sequences will be used. The six temperature ranges simulated by temperature simulation device 44 are: position 1, >15° C.; position 2, 0° C.-15° C.; position 3, −9° C.-0° C.; position 4, −18° C.-−9° C.; position 5, −26° C.-−18° C.; and position 6, <−26° C. The six temperature ranges for the six test positions are simulated using various resistances, supplied by off-the-shelf resistors, as follows: In position 1, a 12K Ohm resistor is used. Position 2 requires a 24K Ohm resistor, and position 3 uses a 40K Ohm resistor. A 75K Ohm resistor is used in position 4, a 120K Ohm resistor is used in position 5, and position 6 requires a 200K Ohm resistor.

Chart II
HEATER SYSTEM OPERATIONAL SEQUENCE DURING TESTING

| TESTER POSITION | TEMPERATURE RANGE* | HEAT MODE | NO. OF HEATERS OPERATING | HEATER ELEMENT OPERATION DURATION (SECONDS) | HEATER CYCLES | KSB CYCLE |
| --- | --- | --- | --- | --- | --- | --- |
| #1 | >15° C. [59° F.] | PRE | NONE | NONE | NONE | ON |
|  |  | POST | NONE | NONE | NONE | ON |
| #2 | 0° C. to 15° C. [32° F. to 59° F.] | PRE | BOTH | 10 | CYCLE No. 1 | OFF |
|  |  | POST | BOTH | 10 | CYCLE No. 1 | OFF |
|  |  | POST | ONE AT A TIME | *10 | CYCLE No. 2 | OFF |
|  |  | POST | ONE AT A TIME | *60 | CYCLE No. 3 | OFF |
|  |  | POST | ONE AT A TIME | *90 | CYCLE No. 4 | OFF |
| #3 | −9° C. to 0° C. [15° F. to 32° F.] | PRE | BOTH | 10 | CYCLE No. 1 | OFF |
|  |  | POST | BOTH | 10 | CYCLE No. 1 | OFF |
|  |  | POST | ONE AT A TIME | *10 | CYCLE No. 2 | OFF |
|  |  | POST | ONE AT A TIME | *60 | CYCLE No. 3 | OFF |
|  |  | POST | ONE AT A TIME | *90 | CYCLE No. 4 | OFF |
| #4 | −18° C. to −9° C. [0° F. to 15° F.] | PRE | BOTH | 15 | CYCLE No. 1 | OFF |
|  |  | POST | BOTH | 15 | CYCLE No. 1 | OFF |
|  |  | POST | ONE AT A TIME | *15 | CYCLE No. 2 | OFF |
|  |  | POST | ONE AT A TIME | *60 | CYCLE No. 3 | OFF |
|  |  | POST | ONE AT A TIME | *90 | CYCLE No. 4 | OFF |

-continued

Chart II

| | | | | | | |
|---|---|---|---|---|---|---|
| #5 | −26° C. to −18° C. [−15° F. to 0° F.] | PRE | BOTH | 17.5 | CYCLE No. 1 | OFF |
| | | POST | BOTH | 15 | CYCLE No. 1 | OFF |
| | | POST | ONE AT A TIME | *15 | CYCLE No. 2 | OFF |
| | | POST | ONE AT A TIME | *60 | CYCLE No. 3 | OFF |
| | | POST | ONE AT A TIME | *90 | CYCLE No. 4 | OFF |
| #6 | <−26° PRE [<−15° F.] | BOTH | 20 | CYCLE | OFF No. 1 | |
| | | POST | BOTH | 13.4 | CYCLE No. 1 | OFF |
| | | POST | ONE AT A TIME | *13.4 | CYCLE No. 2 | OFF |
| | | POST | ONE AT A TIME | *60 | CYCLE No. 3 | OFF |
| | | POST | ONE AT A TIME | *90 | CYCLE No. 4 | OFF |

KEY
PRE: PREHEAT OPERATION
POST: POSTHEAT OPERATION

CYCLES

*10:  10 SECOND CYCLE -
      5 SECONDS ON ONE HEATER ELEMENT
      5 SECONDS ON OTHER HEATER ELEMENT
*13.4: 13.4 SECOND CYCLE -
      6.7 SECONDS ON ONE HEATER ELEMENT
      6.7 SECONDS ON OTHER HEATER ELEMENT
*15:  15 SECOND CYCLE -
      7.5 SECONDS ON ONE HEATER ELEMENT
      7.5 SECONDS ON OTHER HEATER ELEMENT

*60:  60 SECOND CYCLE -
      5 SECONDS ON ONE HEATER ELEMENT
      5 SECONDS ON OTHER HEATER ELEMENT
      NOTE: THIS CYCLE WILL CONTINUE FOR A TOTAL OF 60 SECONDS
*90:  90 SECOND CYCLE -
      2.5 SECONDS ON ONE HEATER ELEMENT
      7.5 SECONDS ON OTHER HEATER ELEMENT
      NOTE: THIS CYCLE WILL CONTINUE FOR A TOTAL OF 90 SECONDS

*THE TEMPERATURE RANGES APPLY TO SYSTEMS USING A 15° C. (59° F.) THERMISTOR.

In position 1, the cold start system (KSB) cycle should be ON, and the operation of the cold start system (KSB) valve control system 24 is tested in this position. Neither of the two heaters should operate in this temperature range regardless of whether the heat mode is in preheat operation or postheat operation, as the temperature of the intake air is sufficiently high. As indicated, the cold start system (KSB) valve will be activated any time the temperature of the air adjacent the intake manifold is above 15° C. and the ignition key is in the ON position. In all other positions of the temperature simulation device 44, the cold start system (KSB) actuation signal should be OFF as the cold start system (KSB) valve control system 24 does not operate within these temperature ranges, and at least one of the two heater elements 12 should be operating and can be tested with the heater element indication device 34.

Within each of positions 2-5, the heating operation begins with a preheat operation in which the ignition switch is on but the engine is not running, and then switches to a postheat mode of operation in which the engine may be running. In the preheat mode, both heaters operate for a predetermined period of time as indicated in the element heat duration column of the chart. In the postheat operation mode, first both heaters operate for a predetermined time period in a first cycle, then the two heaters operate alternately for various lengths of time during second, third, and fourth cycles. The time periods of the second, third, and fourth cycles differ from each other and from those used with other temperature ranges. The precise operations during the various heater cycles are explained at the end of the chart.

Testing of the heater system 10 and KSB valve 24, once one is provided with the device of the present invention, is relatively simple and includes the following steps. In order to test and measure the system voltage, positive voltmeter lead 30 is connected to the positive terminal of the battery 16 and negative voltmeter lead 32 is connected to the negative terminal of battery 16. Leads 36, 38 of the heater element actuation indication device 34 are connected to a positive output terminal of a respective relay 14 to verify heater element actuation. In order to connect the temperature simulation device 44 of the test apparatus 26 to the electronic control module 18, first the thermistor 20 of the heater system 10 must be disconnected from sensor terminal 18a on the electronic control module 18. Then, lead 48 of the temperature simulation device 44 is connected to the sensor terminal 18a of electronic control module 18.

With all of these connections in place, the heater system 10 can be properly tested. Selector 46 of the temperature simulation device 44 is placed in one of the six positions representative of an intake air temperature range as would be detected by the thermistor. The temperature simulation device 44 provides a resistance through lead 48 to the electronic control module 18 that is the same as that provided by the thermistor 20 for the temperature range to be simulated. This causes the heater system 10 to operate correspondingly through the designated heater cycles for the selected temperature range position. As the heater system 10 operates, the voltmeter 28 is viewed by the operator to verify that a minimum battery voltage is supplied to the system and to verify a voltage drop during the actuation cycles as the measured voltage should be less when the heater elements are on. The color coded indication lights 40, 42 are viewed to verify that the heater elements 12 are properly functioning. After the heater system 10 runs through all of the heater cycles for the selected temperature range position, the engine is turned off, the selector 46 is moved to another position, and the engine is turned on again. Then, the operation of the heater system is tested under the new simulated temperature condition, and the voltage and heater actuation measurements and verifications are made. This is repeated for all six temperature range positions.

The length of time of operation of the heater elements in the various modes of operation is measured manually as precise timing is not critical. It is sufficient to detect approximate operating time periods to verify proper operation of the system. The required heater element operation duration may be verified by reference to a chart similar to the chart presented above. However, it is envisioned that various timing devices may be connected to various components of the test apparatus such as the heater element actuation indication device 34 to more precisely measure the actuation time periods for the heater elements.

When the temperature simulation device 44 is in position 1, representative of air temperatures in excess of 15° C., operation of the fuel pump cold start system (KSB) valve may also be tested. To verify the cold start system (KSB) valve actuation cycle, the positive voltmeter lead 30 is removed from the positive terminal of the battery 16 and is connected to the supply voltage to the KSB valve (not shown). This permits the voltmeter 28 to measure the supply voltage to the cold start system (KSB) valve from the cold start system (KSB) electrical supply connection.

Numerous characteristics, advantages, and embodiments of the invention have been described in detail in the foregoing description with reference to the accompanying drawings. However, the disclosure is illustrative only and the invention is not limited to the precise illustrated embodiments. Various changes and modifications may be effected therein by one skilled in the art without departing from the scope or spirit of the invention.

INDUSTRIAL APPLICABILITY

The test apparatus for an electric air intake manifold heater system of the present invention finds application with all compression ignition internal combustion engines used on automotive vehicles and particularly with light trucks. The test apparatus is adapted for in the field testing and servicing of engines as part of a general maintenance program or to diagnose the need for repairs. The test apparatus also may be used upon the initial installation of the heater system to verify proper assembly and installation.

We claim:

1. A test apparatus for testing an electric manifold heating system of an internal combustion engine, said system including at least one heating element for heating intake air, a power supply for electrically powering the system, a temperature sensor for providing an electrical temperature signal representing a manifold temperature; and a controller connected with the temperature sensor, the power supply and the heating element for causing electrical energy from the power supply to be supplied to the heating element in accordance with a predetermined control schedule dependent on the electrical temperature signal, said test apparatus comprising:
   a. simulation means adapted to be operatively connected with the controller for simulating the temperature signal of the temperature sensor over a range of operating temperatures and for providing the simulated temperature signal to the controller; and
   b. actuation test means adapted to be operatively connected with the heating element for providing an indication that the heater element is being actuated in accordance with the predetermined control schedule.

2. The test apparatus of claim 1 further including voltage measurement means for measuring the voltage output of the power supply.

3. The test apparatus of claim 2, wherein said voltage measurement means comprises a voltmeter.

4. The test apparatus of claim 2, further including a portable casing adapted to receive said simulation means, said voltage measurement means, and said actuation test means.

5. The test apparatus of claim 1, wherein said simulation means is selectively operable to simulate specified portions of the range of operating temperatures of the electric manifold heating system.

6. The test apparatus of claim 5 wherein said simulation means includes an operating circuit, a plurality of resistors and a manually operable multiposition switch adapted to selectively connect one of said resistors into said operating circuit to produce signals simulating a plurality of operating temperatures.

7. The test apparatus of claim 1 for use with an internal combustion engine including a fuel delivery system having a fuel pump cold start valve, wherein the test apparatus further includes supply voltage measuring means for measuring the supply voltage to the cold start valve during operation of the simulation means to verify cold start valve actuation.

8. The test apparatus of claim 7, wherein the supply voltage measuring means is also usable to measure the voltage output of the power supply means.

9. The test apparatus of claim 1, for use with an electric manifold heating system including two heating elements disposed in the intake manifold and two actuation switches adapted, respectively, to connect the heating elements to the power supply in response to the controller operating in accordance with a predetermined control schedule relating the operation of the respective heating elements to particular temperature signals within the operating range of manifold temperature, wherein said actuation test means is adapted to separately indicate proper actuation of each heating element in accordance with the predetermined control schedule.

10. The test apparatus of claim 9, for use with a system wherein the predetermined control schedule calls for both heating elements to operate during a first cycle and calls for the two heating elements to operate alternately during subsequent cycles, wherein the actuation test means is adapted to indicate that both elements are actuated as well as indicating when only one heating element is activated.

11. The test apparatus of claim 1, wherein said indication means comprises at least one color coded light for each heating element.

12. A method for testing an electric manifold heating system of an internal combustion engine, said system including at least one heating element for heating intake air, a power supply for electrically powering the system, at least one heating actuation switch connected to the heating element for controlling the heating element, a temperature sensor for providing an electrical temperature signal, representing a manifold temperature, and a controller connected with the temperature sensor, the power supply, and the heating element for causing electrical energy from the power supply to be supplied to the heating element in accordance with a predetermined control schedule dependent on the electrical temperature signal, wherein there is provided a tester including simulation means for simulating a temperature signal of the temperature sensor and for transmitting the simulated temperature signal to the controller, and indication means for indicating heating element actuation, said method comprising the steps of:
 a. operably connecting said indication means to the actuation switch;
 b. disconnecting the temperature sensor from the temperature signal input of the controller;
 c. connecting said tester simulation means to the temperature signal input of the controller;
 d. operating said simulation means to simulate operational temperature ranges of the electric manifold heating system;
 e. comparing the indications produced by said indication means to expected indications according to an expected heating element actuation cycle determined by the predetermined control schedule and the simulated operational temperature range to verify proper operation of said electric manifold heating system for each operational temperature range simulated.

13. The method of claim 12, wherein the final comparison step includes observing at least one indicating light for each heating means to determine whether said heating means are operational.

14. The method of claim 12 for use with an electric manifold heating system having two heating elements which operate according to a control schedule which requires simultaneous activation of both heating elements during a first type of heating element actuating cycle and alternating actuation of the two heating elements during a second type of heating element actuation cycle, wherein the final comparison step includes verifying that both heating elements are actuated during the first type of actuation cycle and that the heating elements are actuated alternately during the second type of actuation cycle.

15. The method of claim 14, wherein the final comparison step further includes verifying that the duration of each heating element actuation cycle corresponds to the expected duration of that heating element actuation cycle.

16. A method for testing an electric manifold heating system of an internal combustion engine, said system including at least one heating element for heating intake air, a power supply for electrically powering the system, at least one heating actuation switch connected to the heating element for controlling the heating element, a temperature sensor for providing an electrical temperature signal, representing a manifold temperature, and a controller connected with the temperature sensor, the power supply, and the heating element for causing electrical energy from the power supply to be supplied to the heating element in accordance with a predetermined control schedule dependent on the electrical temperature signal, wherein there is provided a tester including simulation means for simulating a temperature signal of the temperature sensor and for transmitting the simulated temperature signal to the controller, voltage measurement means for measuring the voltage output of the power supply, and indication means for indicating heating element actuation, said method comprising the steps of:
 a. operably connecting said voltage measurement means to the power supply;
 b. operably connecting said indication means to the actuation switch;
 c. disconnecting said temperature sensing means from the temperature signal input of the controller;
 d. connecting said tester simulation means to the temperature signal input of the controller;
 e. operating said simulation means to simulate at least one operational temperature range of the electric manifold heating system;
 f. comparing the indications produced by said voltage measurement means and indication means to expected indications according to an expected heating element actuation cycle determined by the predetermined control schedule and the simulated operational temperature range to verify proper operation of said electric manifold heating system for each operational temperature range simulated.

17. The method of claim 16 wherein the engine further includes a fuel delivery system having a fuel pump cold start valve provided with an electrical supply for providing an actuation voltage to the valve, wherein the method further comprises the steps of:
 a. at least partially disconnecting the voltage measurement means from the power supply
 b. operably connecting said voltage measurement means to the cold start valve electrical supply;
 c. measuring the actuation voltage of the valve, and
 d. comparing the actuation voltage of the valve to the expected voltage values according to expected indications according to an expected heating element actuation cycle determined by the predetermined control schedule and the simulated operational temperature range to verify proper operation of the cold start valve electrical supply.

18. The method of claim 16, wherein the final comparison step includes observing the voltage measurement means to verify minimum power supply voltage output to verify changes in the power supply voltage output in response to actuation of the heating elements.

19. The method of claim 16 for use with an electric manifold heating system having two heating elements which operate according to a control schedule which requires simultaneous activation of both heating elements during a first type of heating element actuating cycle and alternating actuation of the two heating elements during a second type of heating element actuation cycle, wherein the final comparison step includes verifying that both heating elements are actuated during the first type of actuation cycle and that the heating elements are actuated alternately during the second type of actuation cycle.

20. The method of claim 19 wherein the final comparison step further includes verifying that the duration of each heating element actuation cycle corresponds to the expected duration of that heating element actuation cycle.

* * * * *